(12) United States Patent
Hisano

(10) Patent No.: US 9,767,971 B2
(45) Date of Patent: Sep. 19, 2017

(54) ELECTRONIC APPARATUS

(71) Applicant: KYOCERA CORPORATION, Kyoto-shi, Kyoto (JP)

(72) Inventor: Shuhei Hisano, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/183,275

(22) Filed: Jun. 15, 2016

(65) Prior Publication Data
US 2017/0154742 A1 Jun. 1, 2017

(30) Foreign Application Priority Data
Nov. 27, 2015 (JP) .................................. 2015-231228

(51) Int. Cl.
| | | |
|---|---|---|
| H01H 13/06 | (2006.01) | |
| H01H 13/14 | (2006.01) | |
| H01R 12/59 | (2011.01) | |
| H05K 1/02 | (2006.01) | |
| G06K 9/00 | (2006.01) | |
| G06F 3/044 | (2006.01) | |

(52) U.S. Cl.
CPC ............. *H01H 13/14* (2013.01); *G06F 3/044* (2013.01); *G06K 9/0002* (2013.01); *H01H 13/06* (2013.01); *H01R 12/592* (2013.01); *H05K 1/028* (2013.01); *H01H 13/063* (2013.01)

(58) Field of Classification Search
CPC ...... H01H 13/063; H01H 13/06; H01H 13/14; H01R 12/592
USPC .............................................. 200/302.2, 344
See application file for complete search history.

(56) References Cited

U.S. PATENT DOCUMENTS

| | | | | |
|---|---|---|---|---|
| 9,129,757 B2* | 9/2015 | Kanbayashi | ............. | H01H 9/04 |
| 2008/0049980 A1* | 2/2008 | Castaneda | .......... | G06K 9/00013 |
| | | | | 382/115 |
| 2012/0287587 A1* | 11/2012 | Los | ........................ | H05K 1/147 |
| | | | | 361/749 |

FOREIGN PATENT DOCUMENTS

| | | |
|---|---|---|
| JP | 05-308195 A | 11/1993 |
| JP | 2014-186847 A | 10/2014 |

OTHER PUBLICATIONS

Office Action dated Feb. 7, 2017 issued by the Japan Patent Office in counterpart Japanese Application No. 2015-231228.

* cited by examiner

*Primary Examiner* — Felix O Figueroa
(74) *Attorney, Agent, or Firm* — Procopio Cory Hargreaves and Savitch LLP

(57) ABSTRACT

An electronic apparatus is disclosed. An electronic apparatus comprises a housing, a press switch, a push button, and a cable. The press switch is located in the housing. The push button is a button for pressing the press switch. The cable connects a first electronic part located in the push button to a second electronic part located closer to the inside than the first electronic part and located in the housing. The cable has a fixed portion that is part of the cable between the first electronic part and the second electronic part and that is fixed to the housing. The push button does not face the fixed portion in a direction in which the push button moves by being pushed.

7 Claims, 6 Drawing Sheets

ELECTRONIC APPARATUS

CROSS-REFERENCE TO RELATED APPLICATION

The present application claims priority under 35 U.S.C. §119 to Japanese Patent Application No. 2015-231228, filed on Nov. 27, 2015, entitled "ELECTRONIC APPARATUS". The content of which is incorporated by reference herein in its entirety.

FIELD

Embodiments of present disclosure relate to an electronic apparatus.

BACKGROUND

Various technologies have conventionally been proposed for electronic apparatuses.

SUMMARY

An electronic apparatus is disclosed. In one embodiment, an electronic apparatus comprises a housing, a press switch, a push button, and a cable. The press switch is located in the housing. The push button is a button for pressing the press switch. The cable connects a first electronic part located in the push button to a second electronic part located closer to the inside than the first electronic part and located in the housing. The cable has a fixed portion that is part of the cable between the first electronic part and the second electronic part and that is fixed to the housing. The push button does not face the fixed portion in a direction in which the push button moves by being pushed.

DETAILED DESCRIPTION

<External Appearance of Electronic Apparatus>

Figure 1:
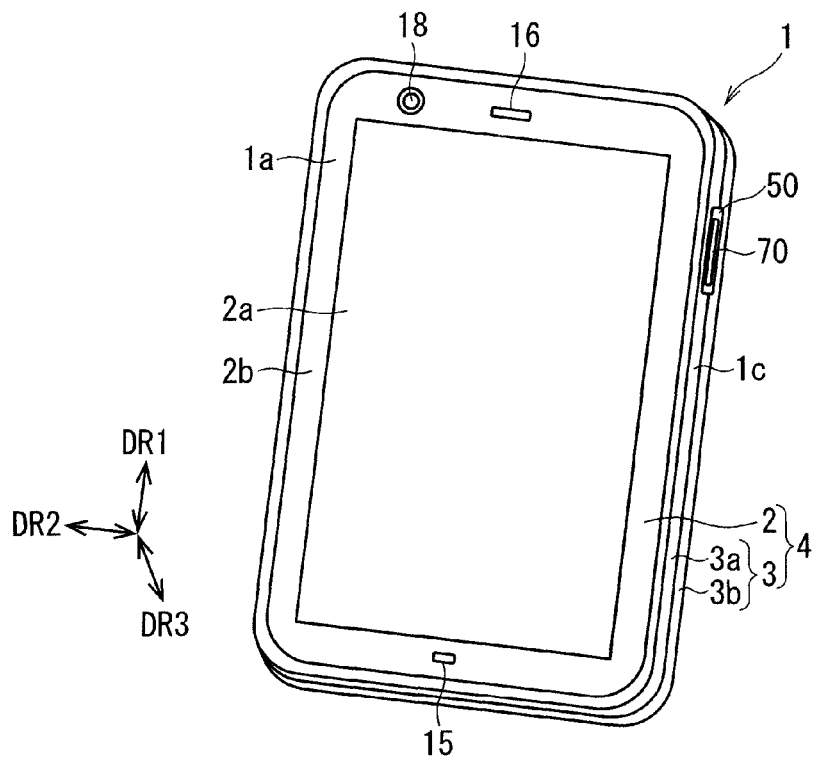
FIG. 1 illustrates a perspective view showing an example of an external appearance of an electronic apparatus.
Figure 2:
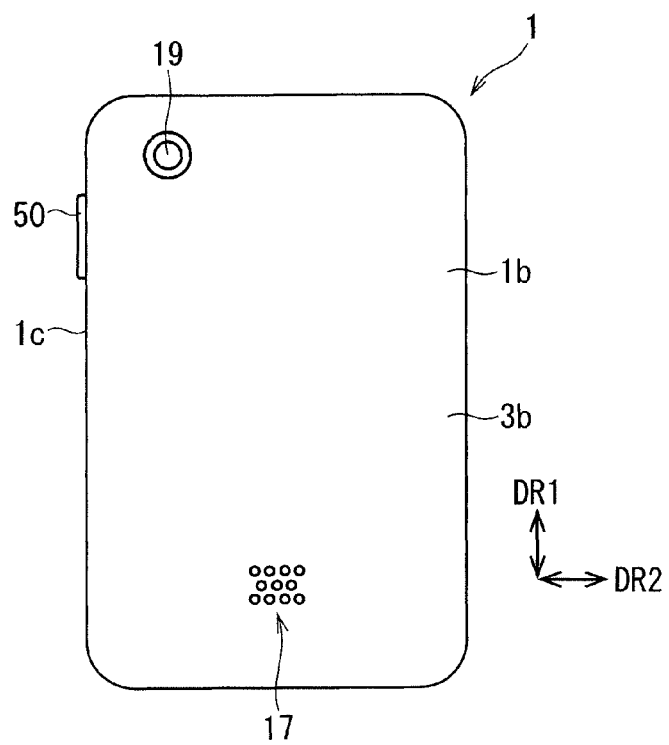
FIG. 2 illustrates a rear view showing an example of the external appearance of the electronic apparatus.
Figure 3:
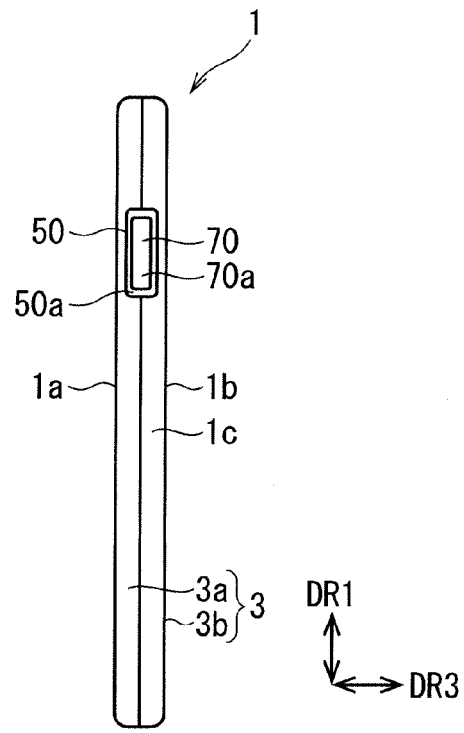
FIG. 3 illustrates a right side view showing an example of the external appearance of the electronic apparatus.

FIGS. 1 to 3 respectively illustrate a perspective view, a rear view, and a right side view schematically showing an example of an external appearance of an electronic apparatus 1. The electronic apparatus 1 is, for example, a mobile phone such as a smartphone.

As illustrated in FIGS. 1 to 3, the electronic apparatus 1 comprises a cover panel 2 located on a front surface 1a of the electronic apparatus 1 and a case 3 on which the cover panel 2 is mounted. The case 3 comprises a front case 3a on which the cover panel 2 is mounted and a rear case 3b mounted on the front case 3a. The rear case 3b is mounted on the front case 3a from a rear surface 1b side of the electronic apparatus 1. The cover panel 2 and the case 3 form the exterior of the electronic apparatus 1 and form a housing 4 of the electronic apparatus 1.

The electronic apparatus 1 has a substantially rectangular shape in plan view. Hereinafter, a longitudinal direction, a lateral direction, and a thickness direction of the electronic apparatus 1 are respectively referred to as a longitudinal direction DR1, a lateral direction DR2, and a thickness direction DR3. Further, the "left side" represents the left side of the electronic apparatus 1 when viewed from the front surface 1a side, and the "right side" represents the right side of the electronic apparatus 1 when viewed from the front surface 1a side.

The case 3 is made of resin, or resin and metal, for example. The resin is polycarbonate resin, ABS resin, or nylon resin, for example. The metal is aluminum, for example. The case 3 may comprise a plurality of members such as the front case 3a and the rear case 3b, and may comprise one member.

The cover panel 2 has a plate shape, and has a substantially rectangular shape in plan view. The longitudinal direction of the cover panel 2 coincides with the longitudinal direction DR1 of the electronic apparatus 1. The cover panel 2 is made of acrylic resin, glass, or sapphire, for example. The cover panel 2 is bonded to the front case 3a with a bonding member 210 (see FIG. 5).

The cover panel 2 has a display region 2a in which various pieces of information such as letters, symbols, and figures displayed by a display panel 120 described below are displayed. Most of a peripheral portion 2b of the cover panel 2 is black by, for example, a film bonded thereon, the peripheral portion 2b surrounding the display region 2a. Thus, most of the peripheral portion 2b of the cover panel 2 is a non-display region in which various pieces of information displayed by the display panel 120 are not displayed.

Figure 5:
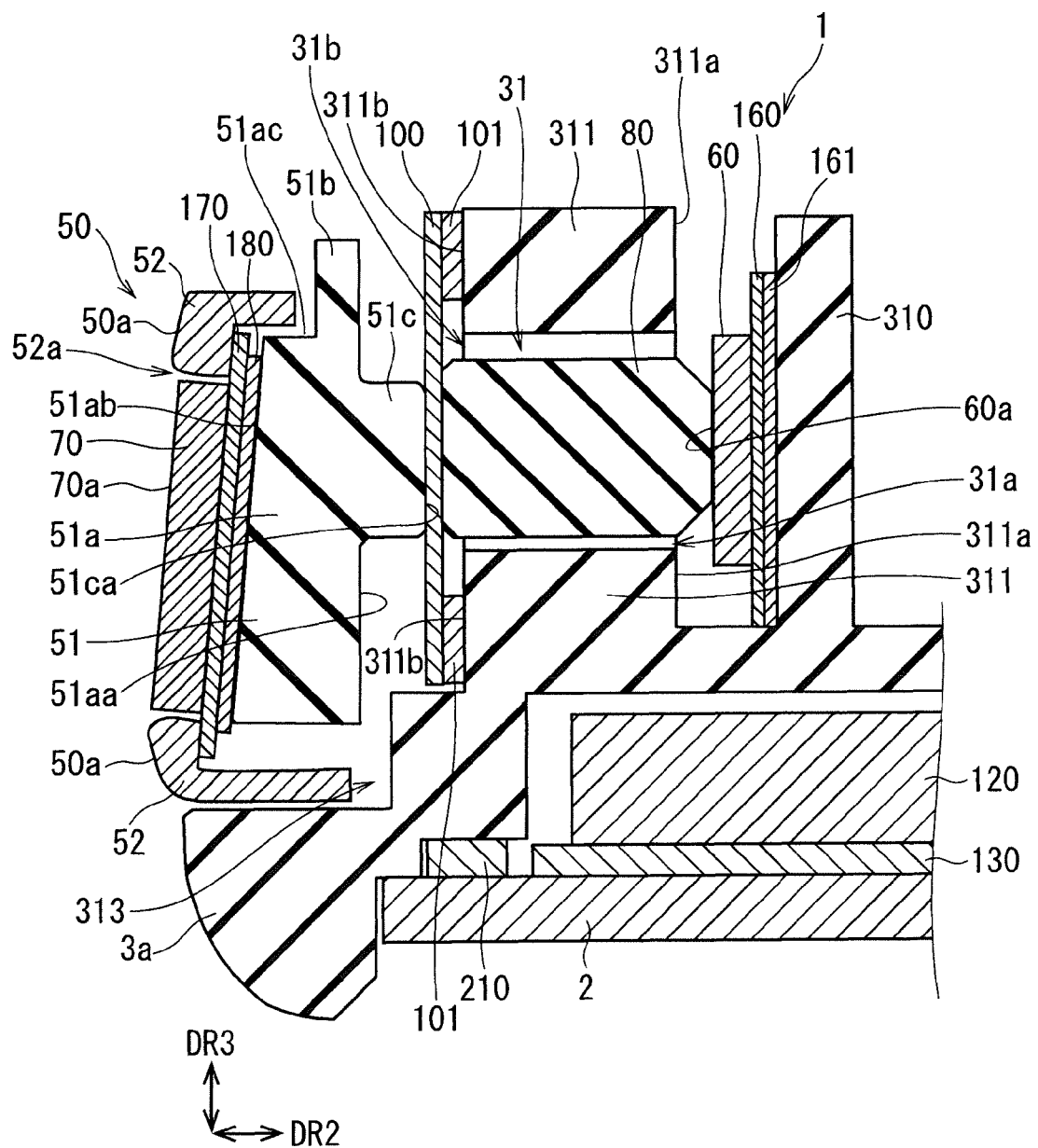
FIG. 5 illustrates an enlarged view showing a cross-sectional structure of the electronic apparatus.

A touch panel 130 is mounted on the rear of the display region 2a (see FIG. 5). The touch panel 130 is a projected capacitive touch panel, for example. When a user operates the display region 2a with an operator such as his or her finger, the operation is detected on the touch panel 130. Thus, the user can provide various instructions to the electronic apparatus 1.

The display panel 120 is mounted on a main surface of the touch panel 130 opposite to the cover panel 2 (see FIG. 5). The display panel 120 is a liquid crystal display or an organic electroluminescent (EL) display, for example.

The positional relationship between the display panel 120 and the touch panel 130 is not limited to one example described above. For example, at least part of the configuration of the touch panel 130 may be buried in the display panel 120 as long as an operation on the display region 2a with an operator can be detected.

As illustrated in FIG. 1, the cover panel 2 has a receiver hole 16 in an upper end portion. An imaging lens 18 included in a front imaging unit, which will be described below, is visually recognizable through the upper end portion of the cover panel 2. The cover panel 2 has a microphone hole 15 in a lower end portion.

As illustrated in FIG. 2, an imaging lens 19 included in a rear imaging unit, which will be described below, is visually recognizable through the upper end portion of the rear surface 1b of the electronic apparatus 1, namely, the upper end portion of the rear surface of the case 3. The case 3 has speaker holes 17 in the rear surface.

A microphone, a receiver, an external speaker, the front imaging unit, and the rear imagining unit included in the electronic apparatus 1 are located in the housing 4 (not shown).

The microphone can convert a sound input from the outside of the electronic apparatus 1 into an electrical sound signal. The sound from the outside of the electronic apparatus 1 is taken inside the electronic apparatus 1 through the microphone hole 15, and the sound is input to the microphone.

The external speaker is a dynamic speaker, for example. The external speaker can convert an electrical sound signal into a sound and then output the sound. The sound output from the external speaker is output to the outside of the electronic apparatus 1 through the speaker holes 17.

The receiver is the dynamic speaker, for example. The receiver can convert an electrical sound signal received by the electronic apparatus 1, for example, into a sound and then output the sound. For example, the receiver can output a received sound. The sound output from the receiver is output to the outside of the electronic apparatus 1 through the receiver hole 16.

In addition, a piezoelectric vibrating element instead of the receiver may be located. The piezoelectric vibrating element can vibrate based on voice signals. The piezoelectric vibrating element is located in the rear surface of the cover panel 2, for example, and the vibration of the piezoelectric vibrating element based on the voice signals can vibrate the cover panel 2. Then, the user can receive the vibration of the cover panel 2 as a voice by moving the cover panel 2 close to his or her ear. The piezoelectric vibrating element instead of the receiver does not need the receiver hole 16.

The front imaging unit comprises the imaging lens 18 and an imaging sensor. The imaging lens 18 is visually recognizable through the upper end portion of the front surface 1a of the electronic apparatus 1. Therefore, the front imaging unit can capture images of an object on the front surface 1a side of the electronic apparatus 1.

The rear imaging unit comprises the imaging lens 19 and an imaging sensor. The imaging lens 19 is visually recognizable through the upper end portion of the rear surface 1b of the electronic apparatus 1. Therefore, the rear imaging unit can capture images of an object on the rear surface 1b side of the electronic apparatus 1.

As illustrated in FIGS. 1 to 3, a push button 50 is located on a right side surface 1c of the electronic apparatus 1, namely, the right side surface of the case 3. The push button 50 protrudes outwardly from the right side surface of the case 3, for example.

The push button 50 is a button for pressing a press switch 60 described below. The user can turn on the press switch 60 by pushing down the push button 50. A function is assigned to the push button 50. The electronic apparatus 1 performs the function assigned to the push button 50 when the push button 50 is pushed down to turn on the press switch 60. Hereinafter, "the push button 50 being pushed" indicates that the press switch 60 pressed by the push button 50 turns on.

The push button 50 is a power button, for example. The power button is also referred to as a "power key". The power button is a button for stopping some functions and causing the functions at a standstill to return to the original state (activating the functions at a standstill) in the electronic apparatus 1. The user can stop some functions and cause the functions at a standstill to return to the original state by operating the push button 50.

The electronic apparatus 1 may include a plurality of push buttons. A function different from a function of the power button is assigned to the push button 50. The position of the push button 50 in the housing 4 is not limited to one example described above. For example, the push button 50 may be located on a portion of the case 3 except for the right side surface, and may be located on the cover panel 2.

As illustrated in FIGS. 1 and 3, a fingerprint sensor 70 is located in the push button 50. A fingerprint detection region 70a of the fingerprint sensor 70 for detecting a fingerprint is exposed from the surface of the push button 50. A push down region 50a of the push button 50 is touched by the user who pushes down the push button 50. The push down region 50a includes the fingerprint detection region 70a.

The fingerprint sensor 70 can detect a fingerprint of a user's finger touching the fingerprint detection region 70a. By pushing the push down region 50a with a finger, the user can push down the push button 50 and can also allow the fingerprint sensor 70 to detect the fingerprint of the finger. The fingerprint sensor 70 can output a fingerprint image indicating a detected fingerprint, for example, as a detection result of the fingerprint. A fingerprint detection method with the fingerprint sensor 70 is a capacitive fingerprint detection method, for example. In addition, the fingerprint detection method with the fingerprint sensor 70 may be another method, such as an optical fingerprint detection method, except for the capacitive fingerprint detection method.

The electronic apparatus 1 can perform user authentication based on a detection result of a fingerprint detected by the fingerprint sensor 70. Specifically, by comparing the fingerprint previously stored in the electronic apparatus 1 with a fingerprint detected by the fingerprint sensor 70, the electronic apparatus 1 can determine whether or not a user having the detected fingerprint is the authorized user (the owner of the electronic apparatus 1, for example).

<Structure Around Push Button>

Figure 4:
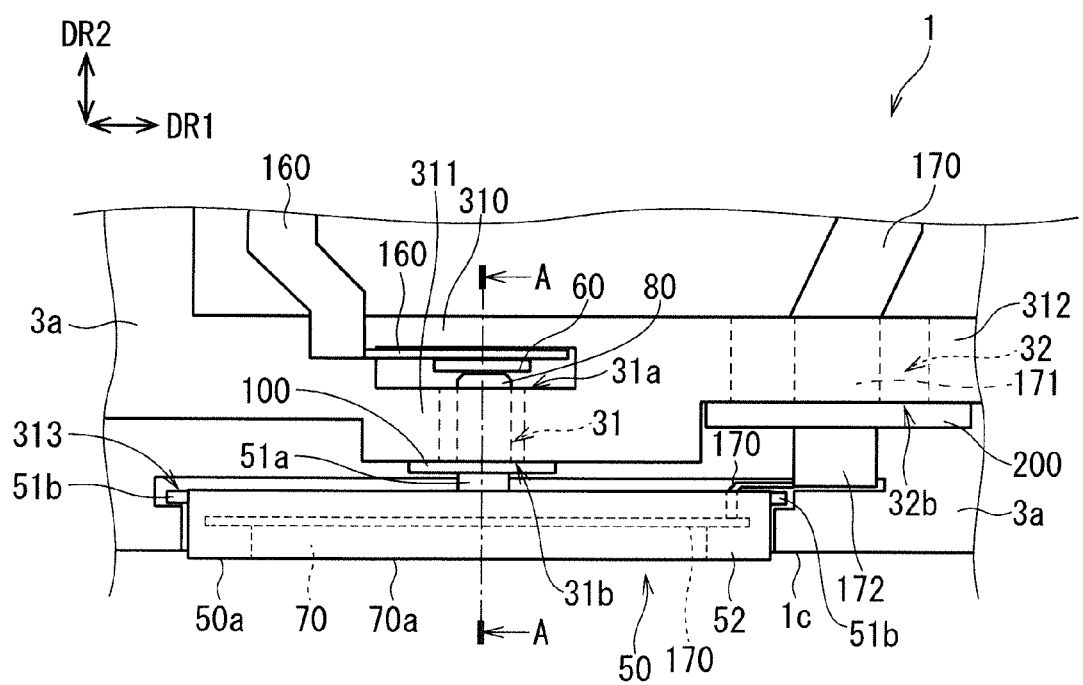
FIG. 4 illustrates an enlarged view showing a structure of the electronic apparatus.

FIG. 4 illustrates an enlarged view showing a structure around the push button 50. FIG. 4 illustrates the structure around the push button 50 when viewed from the rear surface 1b side while the rear case 3b is removed from the electronic apparatus 1.

The push button 50 is located in the right side surface of the front case 3a. The press switch 60 pressed by the push button 50 is located in the front case 3a. The press switch 60 is installed on one end of a flexible printed wiring board 160, and the one end is mounted on the front case 3a. The other end of the flexible printed wiring board 160 is connected to a connector (not shown) located in the housing 4. Thus, a controller that collectively controls actions of the electronic apparatus 1 is electrically connected to the press switch 60. The connector is installed on the substrate mounted in the housing 4.

The front case 3a has a through hole 31 between the push button 50 and the press switch 60. A middle member 80 is located in the through hole 31. An opening 31b of the through hole 31 on the push button 50 side is covered with a watertight member 100. By pushing down the push button 50 exposed from the surface of the case 3, the user can press the press switch 60 located in the case 3 with the watertight member 100 and the middle member 80 between the push button 50 and the press switch 60.

The fingerprint sensor 70 is located in the push button 50. The fingerprint sensor 70 is installed on one end of a flexible printed wiring board 170, and the one end is mounted on the push button 50. The other end of the flexible printed wiring board 170 is connected to a connector 270 described below. Thus, the controller is electrically connected to the fingerprint sensor 70. The connector 270 is installed on a substrate 370 described below, and the substrate 370 is mounted in the housing 4.

The flexible printed wiring board 170 is formed through the through hole 32 formed in the front case 3a. Thus, the flexible printed wiring board 170 can connect the connector 270 in the case 3 to the fingerprint sensor 70 exposed from the surface of the case 3. The flexible printed wiring board 170 is fixed in the through hole 32 with a watertight member 200 blocking the through hole 32.

A structure of the push button 50 and a mounting structure of the flexible printed wiring board 170 in the through hole 32 are described below in detail.

<Structure of Push Button>

The structure of the push button 50 is described below in detail. FIG. 5 illustrates an enlarged view showing a cross-sectional structure taken along an arrow A-A in FIG. 4.

As illustrated in FIGS. 4 and 5, the front case 3a has a mounting portion 310 of a plate shape on which the press switch 60 is mounted. The mounting portion 310 is disposed parallel to the longitudinal direction DR1 and the thickness direction DR3. The front case 3a has a counter portion 311 of the plate shape facing the mounting portion 310. The counter portion 311 has a main surface 311a facing the mounting portion 310 and a main surface 311b opposite to the main surface 311a.

The counter portion 311 has the through hole 31 penetrating along the lateral direction DR2. The through hole 31 is formed in a portion close to the right side surface of the front case 3a. The press switch 60 is mounted on the mounting portion 310 such that a press surface 60a of the press switch 60 faces an opening 31a of the openings 31a, 31b on both sides of the through hole 31, the opening 31a being formed in the main surface 311a of the counter portion 311. Specifically, a portion of the flexible printed wiring board 160 on which the press switch 60 is installed is mounted on the mounting portion 310 with a bonding member 161. The push button 50 is located so as to face the opening 31b of the openings 31a, 31b of the through hole 31, the opening 31b being formed in the main surface 311b of the counter portion 311.

The watertight member 100 is bonded to the main surface 311b of the counter portion 311 with a bonding member 101 so as to cover the opening 31b of the through hole 31. The watertight member 100 has a sheet shape and has flexibility, for example. The watertight member 100 is, for example, a member having watertightness and flexibility such as thermoplastic polyurethane (TPU). The TPU also has elasticity and resilience. The bonding member 101 is located so as to surround the entire circumference of the opening 31b of the through hole 31. The bonding member 101 comprises a double-sided tape having watertightness, for example.

As described above, with the simple configuration in which the watertight member 100 of the sheet shape is bonded with the bonding member 101 having watertightness so as to cover the opening 31b of the through hole 31, water can be made difficult to enter the case 3 through the through hole 31.

The bonding member 101 may be bonded to the entire region of the surface of the watertight member 100 on the opening 31b side instead of being located on the main surface 311b of the counter portion 311 so as to surround the entire circumference of the opening 31b. In other words, the opening 31b may be covered with the bonding member 101. Also in this case, the watertight member 100 can be bonded to the main surface 311b of the counter portion 311 such that the opening 31b is covered with the watertight member 100.

In other words, it suffices that the bonding member 101 has the portion surrounding the entire circumference of the opening 31b.

In a case where the measures to make the through hole 31 watertight are unnecessary, a member having no watertightness may be used instead of the watertight member 100 and the bonding member 101. Also in this case, dust or dirt can be made difficult to enter the case 3 through the through hole 31. Furthermore, in a case where the measures to make the through hole 31 dusttight are unnecessary, the bonding member 101 may be partially located around the circumference of the opening 31b of the through hole 31 instead of being located so as to surround the entire circumference of the opening 31b of the through hole 31. In the case where the measures to make the through hole 31 dusttight are unnecessary, the through hole 31 may not be blocked.

A middle member 80 is located in the through hole 31. The middle member 80 is located between the watertight member 100 and the press switch 60 and is movable in the through hole 31 along the lateral direction DR2. Thus, the push button 50 can press the press switch 60 with the middle member 80 therebetween. Specifically, the push button 50 is pushed from the outside to move along the lateral direction DR2, causing the middle member 80 to move toward the press switch 60 with the watertight member 100 between the push button 50 and the middle member 80. The middle member 80 moves toward the press switch 60, so that the middle member 80 presses the press surface 60a of the press switch 60. When the press switch 60 is pressed, the watertight member 100 is pressed and extended by the push button 50. The middle member 80 is made of resin such as polyoxymethylene (POM).

As described above, the push button 50 presses the press surface 60a of the press switch 60 with the watertight member 100 and the middle member 80 therebetween. Thus, the middle member 80 having a greater length in the press direction allows the push button 50 to press the press switch 60 while the push button 50 and the press switch 60 are located at a distance from each other.

As illustrated in FIGS. 4 and 5, while the push button 50 is not pushed, the push button 50 contacts the watertight member 100. While the push button 50 is not pushed, the middle member 80 contacts the watertight member 100 and the press switch 60. This reduces an amount of deformation of the watertight member 100 when the push button 50 presses the press switch 60. Thus, degradation of the watertight member 100 due to the deformation can be suppressed. Furthermore, the watertight member 100 can be prevented from coming off the front case 3a caused by the deformation.

As illustrated in FIG. 5, the push button 50 has a button body 51 and a cover member 52 mounted on the button body 51. The button body 51 is made of resin, for example. The cover member 52 is made of metal, for example.

The button body 51 has a main portion 51a, and a protruding portion 51b and a press portion 51c that each protrude from the main portion 51a. The main portion 51a is substantially formed in a long and narrow quadrangular prism in the longitudinal direction DR1. The press portion 51c is formed in a substantially cylindrical column and protrudes from a main surface 51aa of the main portion 51a of the push button 50 on the through hole 31 side toward the through hole 31. The press portion 51c faces the through hole 31. A top surface 51ca of the press portion 51c is smaller than a diameter of the through hole 31. The protruding portion 51b protrudes outwardly from a side surface 51*ac* of the main portion 51*a* perpendicular to the push-down direction of the push button 50.

The fingerprint sensor 70 is mounted on a main surface 51*ab* of the main portion 51*a* opposite to the main surface 51*aa*. Specifically, the flexible printed wiring board 170 on which the fingerprint sensor 70 is installed is mounted on the main surface 51*ab* of the button body 51 with a bonding member 180. The fingerprint sensor 70 has a long plate shape along the longitudinal direction DR1, for example. The fingerprint sensor 70 is mounted on the button body 51 such that the longitudinal direction of the fingerprint sensor 70 coincides with the longitudinal direction of the button body 51.

The cover member 52 is mounted on the button body 51 such that the fingerprint detection region 70*a* of the fingerprint sensor 70 is exposed from an opening 52*a* of the cover member 52. The cover member 52 is bonded to the flexible printed wiring board 170, for example. Part of the cover member 52 is exposed from the surface of the case 3.

The push down region 50*a* of the push button 50 including the fingerprint detection region 70*a* of the fingerprint sensor 70 is pushed, causing the push button 50 to be pushed down. Therefore, it can be said that the fingerprint sensor 70 forms part of the push button 50.

The push down region 50*a* of the push button 50 is inclined with respect to the thickness direction DR3. Specifically, the end portion of the push down region 50*a* on the rear surface 1*b* side of the electronic apparatus 1 is inclined toward the inside of the electronic apparatus 1. Thus, the user can easily push the push button 50 with a finger of a hand when holding the electronic apparatus 1 from the rear surface 1*b* side with the hand.

The positional relationship between the fingerprint sensor 70 and the push button 50 is not limited to one example described above. As long as a fingerprint of a user's finger touching the push down region 50*a* of the push button 50 can be detected, the fingerprint sensor 70 may be located inside the push button 50 or on the rear side of the push button 50 instead of being located on the surface of the push button 50. In other words, the fingerprint detection region 70*a* of the fingerprint sensor 70 may be covered with a member forming the push button 50 instead of being exposed from the surface of the push button 50.

The front case 3*a* has a mounting portion 313 for allowing the push button 50 to be mounted on the front case 3*a*. The push button 50 is fit with the mounting portion 313 and mounted on the front case 3*a*.

When the rear case 3*b* is mounted on the front case 3*a*, the protruding portion 51*b* of the push button 50 is sandwiched between the front case 3*a* and the rear case 3*b* in the lateral direction DR2. Thus, the push button 50 hardly comes off the case 3.

<Mounting Structure of Flexible Printed Wiring Board>

As described above, the flexible printed wiring board 170 is mounted on the push button 50, and the substrate 370 on which the connector 270 is installed is mounted in the housing 4. Thus, when the push button 50 is pushed down to move along the lateral direction DR2, part of the flexible printed wiring board 170 between the push button 50 and the connector 270 becomes deformed. For example, when the push button 50 is pushed down, the part of the flexible printed wiring board 170 between the push button 50 and the connector 270 is bent along the lateral direction DR2. This may cause a load on a connection portion between the flexible printed wiring board 170 and the connector 270.

Figure 6:
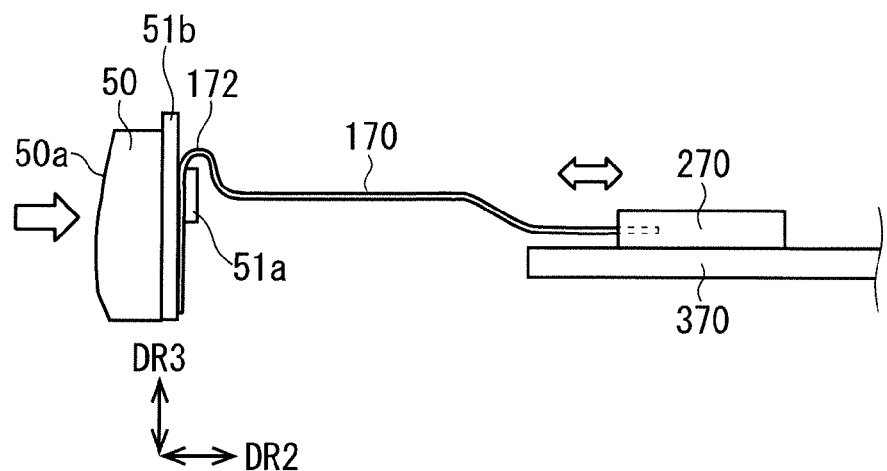
FIGS. 6 and 7 illustrate a push button being pushed down.
Figure 7:
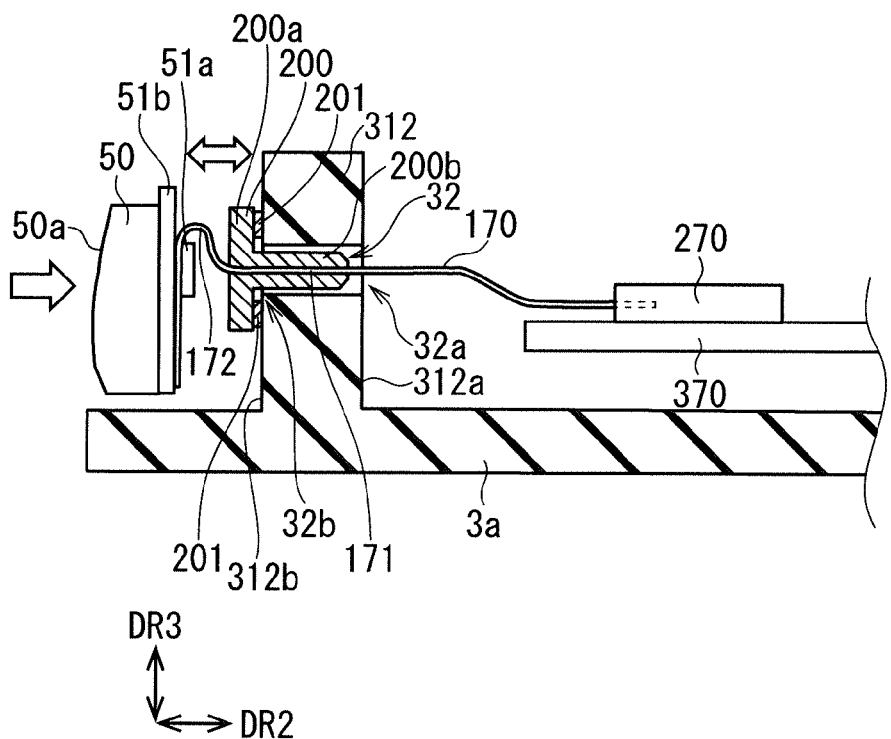

FIGS. 6 and 7 illustrate the push button 50 being pushed down. FIGS. 6 and 7 illustrate the push button 50 when viewed from the lateral surface side of the push button 50. Unnecessary parts for description are omitted from FIGS. 6 and 7. FIG. 6 illustrates the flexible printed wiring board 170 that is not fixed in the front case 3*a*. As illustrated in FIG. 6, an end portion, which is opposite to the push button 50, of two ends of the flexible printed wiring board 170 is connected to the connector 270 installed on the substrate 370 located in the housing 4. The substrate 370 is mounted in the housing 4.

As illustrated in FIG. 6, in the case where the flexible printed wiring board 170 is not fixed in the front case 3*a*, the push button 50 is pushed down to move along the lateral direction DR2, so that the flexible printed wiring board 170 is deformed so as to be bent along the lateral direction DR2, for example. The flexible printed wiring board 170 has a curved portion 172 protruding toward the rear surface 1*b* of the electronic apparatus 1, for example. The curved portion 172 of the flexible printed wiring board 170 is easily bent when the push button 50 is pushed down. When the push button 50 is pushed down and the flexible printed wiring board 170 is deformed, a load is easily applied to the connection portion between the flexible printed wiring board 170 and the connector 270. For example, reaction force of the flexible printed wiring board 170 is easily applied to the connection portion. Thus, a poor connection may occur due to a wearing down of an electrical contact in the connection portion.

On the other hand, as illustrated in FIGS. 4 and 7, the flexible printed wiring board 170 is fixed in the front case 3*a* with the watertight member 200 in the electronic apparatus 1. Thus, a load is hardly applied to the connection portion between the flexible printed wiring board 170 and the connector 270. The structure in which the flexible printed wiring board 170 is mounted on the front case 3*a* is described below in detail.

As illustrated in FIGS. 4 and 7, the front case 3*a* has a mounting portion 312 of the plate shape in which the flexible printed wiring board 170 is fixed. The mounting portion 312 is disposed parallel to the longitudinal direction DR1 and the thickness direction DR3. The mounting portion 312 has a main surface 312*a* on the connector 270 side and a main surface 312*b* opposite to the main surface 312*a*.

The mounting portion 312 has the through hole 32 penetrating along the lateral direction DR2. The through hole 32 is formed in a portion close to the right side surface of the front case 3*a*. The through hole 32 is parallel to the through hole 31 in the longitudinal direction DR1.

The flexible printed wiring board 170 is passed through the through hole 32. The flexible printed wiring board 170 has a mounting portion 171 on which the watertight member 200 is mounted. The mounting portion 171 is located between the push button 50 and the connector 270. The watertight member 200 is made of resin and is integrally formed with the flexible printed wiring board 170, for example.

The watertight member 200 has a plate portion 200*a* and a protruding portion 200*b* protruding from the plate portion 200*a*. The protruding portion 200*b* is formed in a substantially cylindrical column and has an outer diameter smaller than a diameter of the through hole 32. The protruding portion 200*b* is inserted into the through hole 32 from an opening 32*b* side of the openings 32*a*, 32*b* of the through hole 32, the opening 32*b* being formed in the main surface 312*b*. The plate portion 200*a* is mounted on the main surface 312*b* so as to cover the opening 32*b*. Specifically, the plate portion 200*a* is mounted on the front case 3*a* with a bonding member 201 that is located so as to surround the entire circumference of the opening 32*b* of the through hole 32 and that has watertightness. The opening 32*b* of the through hole 32 is blocked by the watertight member 200.

In the electronic apparatus 1 as illustrated in FIG. 7, the watertight member 200 mounted on the mounting portion 171 of the flexible printed wiring board 170 is fixed in the through hole 32, so that the mounting portion 171 is fixed in the front case 3*a*. Hereinafter, the mounting portion 171 may be referred to as a "fixed portion 171".

In the case where the flexible printed wiring board 170 is fixed in the front case 3*a*, the push button 50 is pushed down to move along the lateral direction DR2, so that the portion of the flexible printed wiring board 170 between the push button 50 and the watertight member 200 is deformed while the portion of the flexible printed wiring board 170 between the watertight member 200 and the connector 270 is not deformed. Thus, a load is hardly applied to the connection portion between the flexible printed wiring board 170 and the connector 270. Therefore, a poor connection in the connection portion can be suppressed.

The flexible printed wiring board 170 is fixed in the through hole 32 through which the flexible printed wiring board 170 is passed instead of being fixed in a portion of the front case 3*a* other than the through hole 32. With such a simple configuration, the flexible printed wiring board 170 can be fixed in the front case 3*a*.

Moreover, the through hole 32 is blocked by the watertight member 200, so that water is made difficult to enter the case 3 through the through hole 32.

The flexible printed wiring board 170 is fixed in the through hole 32 with the watertight member 200, so that the watertight member 200 can achieve both of the measures to make the through hole 32 watertight and the fixing of the flexible printed wiring board 170 in the front case 3*a*.

In a case where the measures to make the through hole 32 watertight are unnecessary, a member having no watertightness may be used instead of the watertight member 200 and the bonding member 201. Also in this case, dust or dirt can be made difficult to enter the case 3 through the through hole 32. Furthermore, in a case where the measures to make the through hole 32 dusttight are unnecessary, the bonding member 201 may be partially located around the circumference of the opening 32*b* of the through hole 32 instead of being located so as to surround the entire circumference of the opening 32*b* of the through hole 32. In the case where the measures to make the through hole 31 dusttight are unnecessary, the through hole 32 may not be blocked.

In addition, it suffices that the fixed portion 171 of the flexible printed wiring board 170 is fixed to the housing 4. The fixed portion 171 may be fixed in a portion of the front case 3*a* other than the through hole 32, or may be fixed in the rear case 3*b*. Also in this case, the load is hardly applied to the connection portion between the flexible printed wiring board 170 and the connector 270. The flexible printed wiring board 170 may be fixed to the housing 4 with a member except for the watertight member 200, for example, a bonding member. The flexible printed wiring board 170 may be directly fixed on the housing 4. For example, the flexible printed wiring board 170 may be directly fixed on the housing 4 by being sandwiched between the front case 3*a* and the rear case 3*b*.

<Positional Relationship Between Push Button and Flexible Printed Wiring Board>

When the push button 50 is pushed, the curved portion 172 of the flexible printed wiring board 170 is bent, for example, so that the push button 50 is movable along the lateral direction DR2. When the push button 50 is pushed, the reaction force of the flexible printed wiring board 170 to return to the original shape occurs.

As described above, the flexible printed wiring board 170 is fixed in the through hole 32 with the watertight member 200 in the electronic apparatus 1. Thus, the portion to which the reaction force of the flexible printed wiring board 170 is applied is located closer to the push button 50 compared to the case where the flexible printed wiring board 170 is not fixed in the front case 3*a*. Consequently, the reaction force of the flexible printed wiring board 170 is easily applied to the push button 50. The reaction force of the flexible printed wiring board 170 applied to the push button 50 is described below in detail.

Figure 8:
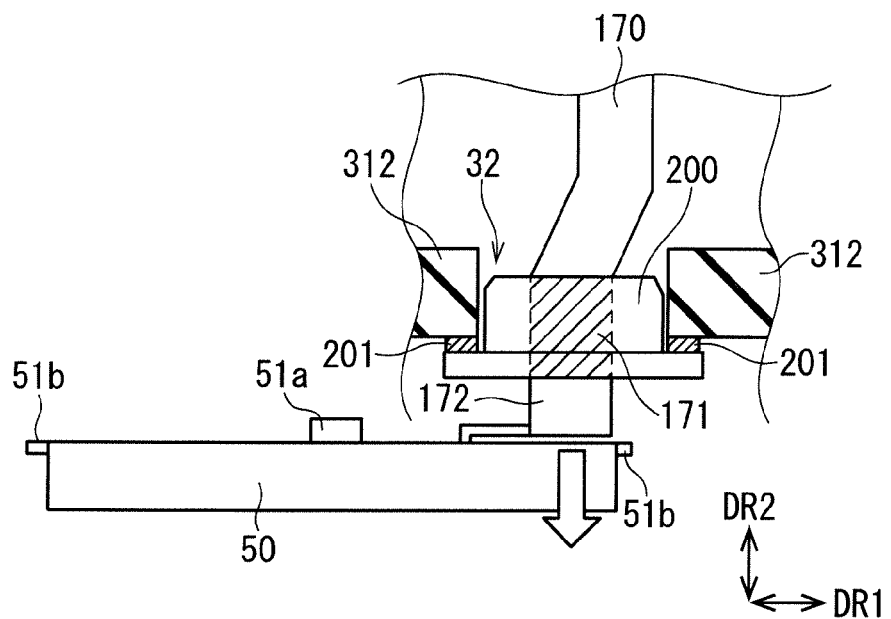
FIGS. 8 and 9 illustrate a positional relationship between the push button and a flexible printed wiring board.
Figure 9:
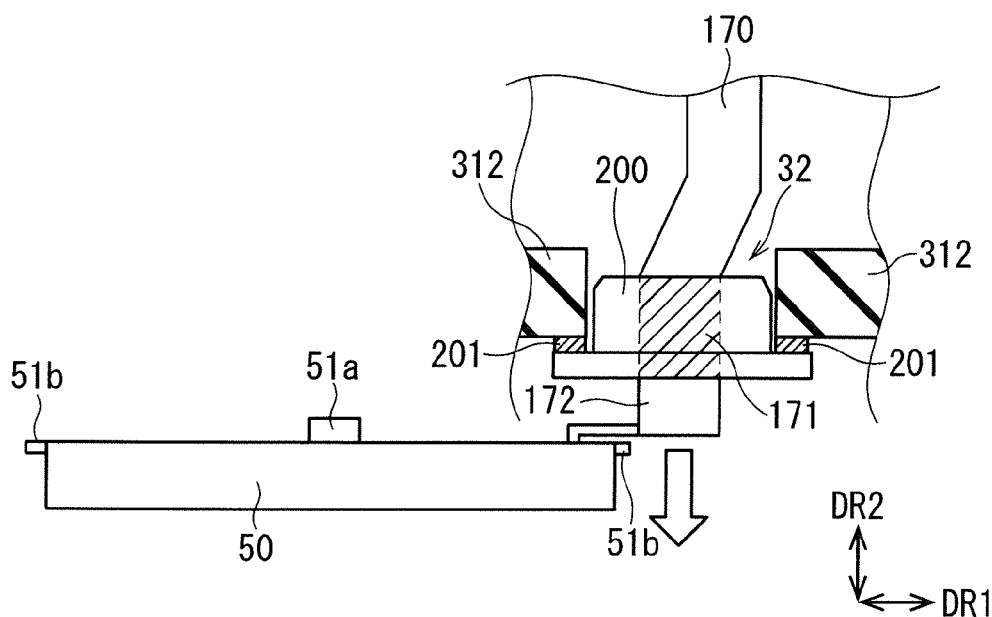

FIGS. 8 and 9 illustrate a positional relationship between the push button 50 and flexible printed wiring board 170. FIGS. 8 and 9 illustrate the push button 50 when viewed from the rear surface 1*b* side of the electronic apparatus 1. Unnecessary parts for description are omitted from FIGS. 8 and 9. In FIGS. 8 and 9, the fixed portion 171 of the flexible printed wiring board 170 is indicated by thin oblique lines.

FIG. 8 illustrates the push button 50 that faces the fixed portion 171 of the flexible printed wiring board 170 in a direction in which the push button 50 moves by being pushed, namely, the lateral direction DR2. As illustrated in FIG. 8, when the push button 50 faces the fixed portion 171 of the flexible printed wiring board 170 in the lateral direction DR2, the reaction force of the flexible printed wiring board 170 is easily applied to the push button 50. For example, the reaction force of the flexible printed wiring board 170 is easily applied to the portion of the push button 50 facing the fixed portion 171.

In the case where the reaction force of the flexible printed wiring board 170 is easily applied to the push button 50, the user may feel a poor sense of operation (sense of a push) when pushing the push button 50. The case may also result in poor operability of the push button 50, which may make it difficult for the user to push the push button 50. For example, when the user pushes an end portion of the push button 50 opposite to an end portion facing the fixed portion 171, the press switch 60 may not be pressed.

On the other hand, in the electronic apparatus 1 as illustrated in FIG. 9, the push button 50 does not face the fixed portion 171 of the flexible printed wiring board 170 in the lateral direction DR2. Thus, the reaction force of the flexible printed wiring board 170 is hardly applied to the push button 50 compared to the case where the push button 50 faces the fixed portion 171 of the flexible printed wiring board 170 in the lateral direction DR2. Consequently, the sense of operation and the operability of the push button 50 can be improved. In this case, the reaction force of the flexible printed wiring board 170 is easily applied to the front case 3*a*, for example (see FIG. 4).

<Various Modifications>
<First Modification>

Figure 10:
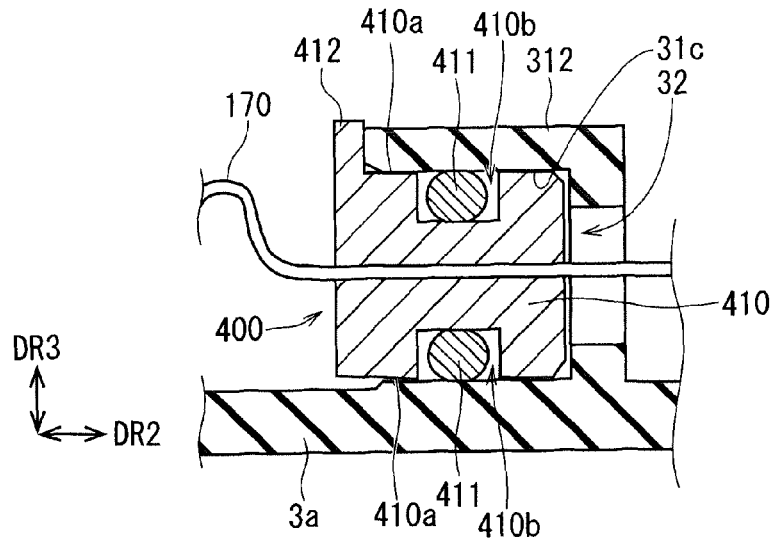
FIGS. 10 and 11 illustrate an enlarged view showing a cross-sectional structure of an electronic apparatus.

In one example described above, the watertight member 200 blocking the through hole 32 is mounted with the bonding member 201 located so as to surround the entire circumference of the opening 32*b* of the through hole 32, but the measures to make the through hole 32 watertight are not limited to one example. For example, the measures to make the through hole 32 watertight may be performed with a watertight member 400 as illustrated in FIG. 10.

The watertight member 400 is mounted on the flexible printed wiring board 170. The watertight member 400 is integrally formed with the flexible printed wiring board 170, for example. The watertight member 400 has a body portion 410 and a portion 411 of a ring shape that is mounted in the entire circumference of the body portion 410 along a circumferential direction of a side surface 410a of the body portion 410. The side surface 410a of the body portion 410 has a groove portion 410b in the entire circumference along the circumferential direction of the side surface 410a of the body portion 410. The member 411 is fit in the groove portion 410b. The watertight member 400 is placed in the through hole 32 such that the member 411 contacts an interior wall 31c of the through hole 32. The member 411 contacts the entire region of the interior wall 31c of the through hole 32 in the circumferential direction of the through hole 32. The body portion 410 is fixed in the through hole 32 by the resilience of the member 411. This can achieve the measures to make the through hole 32 watertight and the fixing of the flexible printed wiring board 170 in the through hole 32.

The watertight member 400 is placed in the through hole 32 such that a protruding portion 412 located on one end of the body portion 410 faces the mounting portion 312 of the front case 3a. This can prevent the whole watertight member 400 from entering the through hole 31.

<Second Modification>

Figure 11:
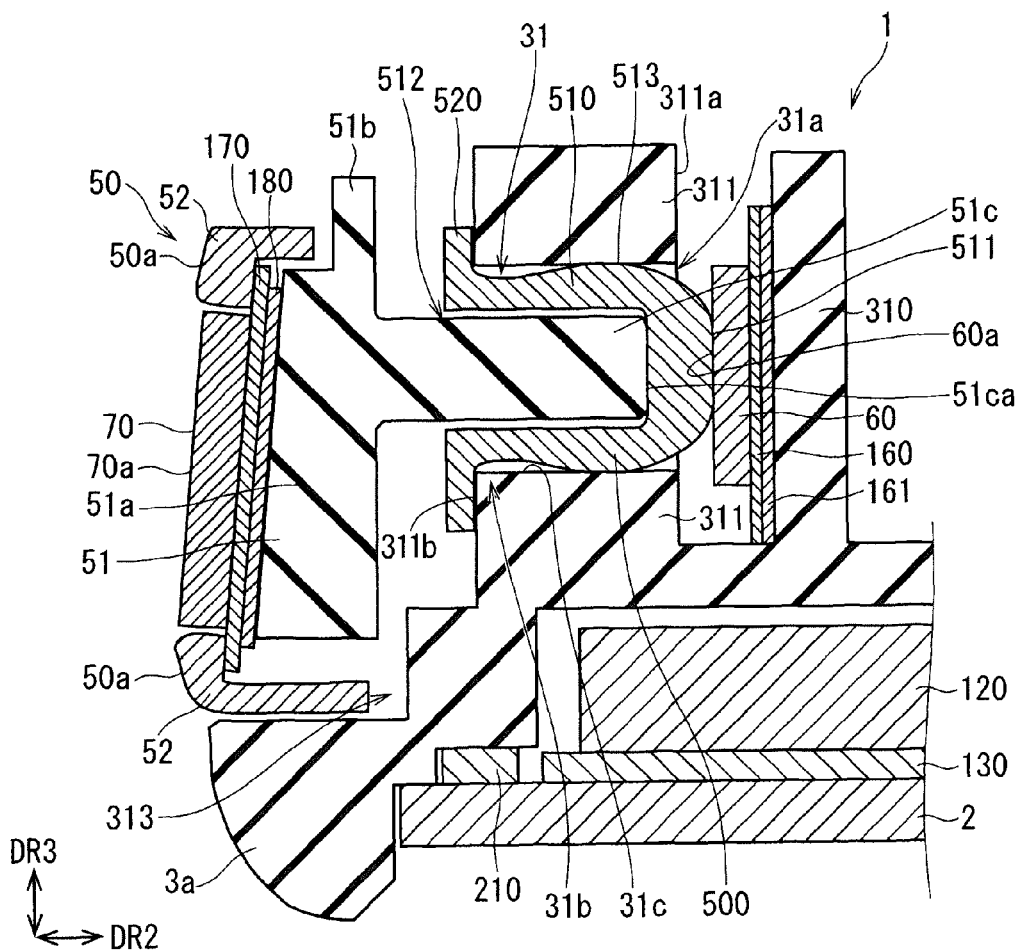

In one example described above, the watertight member 100 of the sheet shape is mounted with the bonding member 101, which surrounds the entire circumference of the opening 31b, so as to cover the opening 31b of the through hole 31, but the measures to make the through hole 31 watertight are not limited to one example. For example, the measures to make the through hole 31 watertight may be performed with a watertight member 500 as illustrated in FIG. 11.

The watertight member 500 is made of resin, for example. The watertight member 500 has resilience while being harder than the watertight member 100 described above. The watertight member 500 is a molded component and has a three-dimensional shape.

The watertight member 500 has a body portion 510 having a tubular shape with one end closed and a flange portion 520 located on the other end of the body portion 520 on an opening 512 side. The flange portion 520 surrounds the entire circumference of the opening 512 of the body portion 510.

The body portion 510 is placed in the through hole 31 such that a bottom surface 511 of the body portion 510 faces the press switch 60 and the opening 512 of the body portion 510 faces the push button 50. The flange portion 520 is disposed on the main surface 311b of the counter portion 311 of the front case 3a. The flange portion 520 surrounds the entire circumference of the opening 31b of the through hole 31. Thus, the opening 31b of the through hole 31 is blocked by the watertight member 500.

A side surface 513 of the body portion 510 in the through hole 31 contacts an interior wall 31c of the through hole 31. The side surface 513 of the body portion 510 contacts the entire region of the interior wall 31c of the through hole 31 in the circumferential direction of the through hole 31. Thus, the through hole 31 is blocked by the body portion 510. The press portion 51c of the push button 50 is inserted into the body portion 510 of the watertight member 500 from the opening 512 side.

In the electronic apparatus 1 having such a structure, the push button 50 presses the press switch 60 with the body portion 510 of the watertight member 500 therebetween. At this time, the bottom surface 511 of the body portion presses the press surface 60a of the press switch 60.

In this manner, the body portion 510 of the watertight member 500 blocks the through hole 31, so that water can be prevented from entering the press switch 60 side through the through hole 31.

At the time of assembly of the electronic apparatus 1, after the push button 50 and the watertight member mounted on the flexible printed wiring board 170 are mounted on the front case 3a, the rear case 3b is mounted thereon. The push button 50 having the protruding portion 51b sandwiched between the front case 3a and the rear case 3b is retained by the case 3. Thus, the push button 50 is hardly fixed on the front case 3a before the rear case 3b is mounted on the front case 3a. Consequently, the position of the push button 50 may be shifted by the reaction force of the flexible printed wiring board 170 while the watertight member mounted on the flexible printed wiring board 170 is mounted on the front case 3a.

For the push button 50 having the structure in which the press portion 51c is placed in the body portion 510 of the watertight member 500, as illustrated in FIG. 11, the position of the push button 50 when being mounted is relatively hardly shifted.

In the electronic apparatus 1, the push button 50 does not face the fixed portion 171 of the flexible printed wiring board 170 in the direction in which the push button 50 moves by being pushed. Thus, the reaction force of the flexible printed wiring board 170 is hardly applied to the push button 50, and the position of the push button 50 when being mounted on the front case 3a is hardly shifted. This facilitates the mounting of the push button 50 on the front case 3a.

In each example described above, the disclosure applied to a mobile phone is described as an example. The disclosure is also applicable to another electronic apparatus including a press switch on which a flexible printed wiring board is mounted. For example, the disclosure is also applicable to personal computers, tablet terminals, and wearable electronic apparatuses put on an arm.

While the electronic apparatus 1 has been described above in detail, the above description is in all aspects illustrative and not restrictive. In addition, various modifications described above are applicable in combination as long as they are not mutually inconsistent. It is understood that numerous modifications which have not been exemplified can be devised without departing from the scope of the present disclosure.

The invention claimed is:

1. An electronic apparatus, comprising:
   a housing;
   a press switch located in the housing;
   a push button for pressing the press switch; and
   a cable connecting a first electronic part located in the push button to a second electronic part located closer to an inside than the first electronic part and located in the housing,
   wherein
   the cable has a fixed portion that is part of the cable between the first electronic part and the second electronic part and is fixed to the housing,
   the push button does not face the fixed portion in a direction in which the push button moves by being pushed,
   the housing has a through hole,
   the press switch has a press surface facing the through hole,
   the electronic apparatus further comprises a bonding member that is directly bonded to an entire external circumference of an external opening of the through hole and comprises a member located between the press switch and the push button and bonded to the housing with the bonding member, such that the member blocks the external opening, and the push button presses the press surface with the member between the press surface and the push button.

2. The electronic apparatus according to claim 1, wherein the cable passes through the through hole, the first electronic part is located closer to an outside with respect to the through hole, the second electronic part is located closer to the inside with respect to the through hole, and the fixed portion is fixed in the through hole.

3. The electronic apparatus according to claim 2, wherein the cable penetrates the member and is fixed in the through hole.

4. The electronic apparatus according to claim 1, further comprising a middle member located between the push button and the press switch and located in the through hole, wherein the push button presses the press surface with the member and the middle member between the press surface and the push button.

5. The electronic apparatus according to claim 4, wherein the member is located between the push button and the middle member.

6. The electronic apparatus according to claim 1, wherein the first electronic part comprises a fingerprint sensor.

7. The electronic apparatus according to claim 1, wherein the cable comprises a flexible printed wiring board.

\* \* \* \* \*